(12) United States Patent
Robertson

(10) Patent No.: US 10,955,477 B2
(45) Date of Patent: Mar. 23, 2021

(54) POWER DISTRIBUTION HEALTH MANAGEMENT AND MONITORING

(71) Applicant: Hamilton Sundstrand Corporation, Charlotte, NC (US)

(72) Inventor: Nicholas J. Robertson, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 88 days.

(21) Appl. No.: 16/023,524

(22) Filed: Jun. 29, 2018

(65) Prior Publication Data

US 2020/0003838 A1    Jan. 2, 2020

(51) Int. Cl.
*G01R 31/327*    (2006.01)
*H01H 9/54*    (2006.01)
*H01H 47/00*    (2006.01)

(52) U.S. Cl.
CPC ......... *G01R 31/3278* (2013.01); *H01H 9/54* (2013.01); *H01H 47/002* (2013.01); *B64D 2221/00* (2013.01)

(58) Field of Classification Search
CPC .. G01R 15/202; G01R 33/07; G01R 19/0092; G01R 33/075; G01R 33/077; H03F 3/45995; G01D 11/245; G01D 5/142
USPC .................. 324/117 H, 244, 207.2, 251, 252
See application file for complete search history.

(56) References Cited

U.S. PATENT DOCUMENTS

| 3,771,056 | A | * | 11/1973 | Zimmerman | G01R 27/32 324/642 |
| 4,590,477 | A | * | 5/1986 | Regnier | G01S 13/785 342/173 |
| 6,720,908 | B1 | * | 4/2004 | Puglia | G01S 13/44 342/113 |
| 6,774,639 | B1 | * | 8/2004 | Unsworth | G01R 31/1227 324/547 |
| 7,005,995 | B2 | | 2/2006 | Hornsby et al. | |
| 7,190,092 | B2 | | 3/2007 | Ivanciw et al. | |
| 7,532,012 | B2 | * | 5/2009 | Cern | G01R 31/1272 324/536 |

(Continued)

FOREIGN PATENT DOCUMENTS

| DE | 102014211065 A1 | 12/2015 |
| JP | H05266290 A | 10/1993 |

OTHER PUBLICATIONS

Partial European Search Report for European Patent Application No. EP19183403.5, dated Nov. 11, 2019.

(Continued)

*Primary Examiner* — Giovanni Astacio-Oquendo
(74) *Attorney, Agent, or Firm* — Locke Lord LLP; Scott D. Wofsy; Judy R. Naamat

(57) ABSTRACT

A switch arrangement includes a switch with a source lead and a load lead, a sensor coupled to the switch, and a switch monitor. The switch monitor is in communication with the sensor and is responsive to instructions recorded on a memory to receive a measurement of a switch parameter from the sensor, compare the measurement to a baseline associated with the switch, and determine switch margin using the comparison of the measurement with the baseline associated with the switch. Aircraft electrical systems and methods of monitoring electrical systems are also disclosed.

20 Claims, 5 Drawing Sheets

(56) References Cited

U.S. PATENT DOCUMENTS

| | | | |
|---|---|---|---|
| 7,676,333 B2 * | 3/2010 | Younsi | G01R 31/1227 |
| | | | 324/458 |
| 7,732,939 B2 | 6/2010 | Fuller et al. | |
| 8,836,338 B2 | 9/2014 | Tyler et al. | |
| 9,335,366 B2 | 5/2016 | Handy | |
| 9,696,056 B1 * | 7/2017 | Rosenberg | F24F 11/30 |
| 10,076,264 B2 * | 9/2018 | Brady-Kalnay | A61B 5/055 |
| 10,599,133 B2 * | 3/2020 | Wang | G05B 23/0272 |
| 2005/0218899 A1 | 10/2005 | Wong et al. | |
| 2015/0153413 A1 | 6/2015 | Hasse et al. | |
| 2017/0076891 A1 | 3/2017 | Dold et al. | |

OTHER PUBLICATIONS

Extended European Search Report for European Patent Application No. EP19183403.5, dated Feb. 11, 2020.

* cited by examiner

POWER DISTRIBUTION HEALTH MANAGEMENT AND MONITORING

BACKGROUND OF THE INVENTION

1. Field of the Invention

The present disclosure relates to electrical systems, and more particularly to managing and monitoring electrical systems using switch cycle and load measurements.

2. Description of Related Art

Power distribution systems, such as in aircraft, commonly include switches to control the flow of power to electrical loads connected to the system. The system switches generally cycle on and off, the distribution system providing electrical power when switch (or switches) connecting a load to the power system are on and power flow ceasing when off. Cycling of the switches is typically governed by the operational needs of the electrical loads.

Over time the performance of switches in some electrical systems can change. For example, movement of components in electromechanical switches and relays can cause wear while voltage and current flow stress in solid state switches can cause resistance change over time. In either case the performance change can, over time, be sufficient that the switch need by replaced. Switch replacement generally requires taking the electrical load, and in some instances the power distribution system, out of service for maintenance and/or repair. The design of power distribution systems are therefore typically tested and certified prior to use. And once built according to a certified design, a power distribution system may undergo 'as-built' testing to ensure compliance with the certified design, such as in qualification and acceptance program.

Such conventional methods and systems have generally been considered satisfactory for their intended purpose. However, there is still a need in the art for improved power distribution systems and methods of power distribution health management and monitoring. The present disclosure provides a solution for this need.

SUMMARY OF THE INVENTION

A switch arrangement includes a switch with a source lead and a load lead, a sensor coupled to the switch, and a switch monitor. The switch monitor is in communication with the sensor and responsive to instructions recorded on a memory to receive a measurement of a switch parameter from the sensor, compare the measurement to a baseline associated with the switch, and determine switch margin using the comparison of the measurement with the baseline associated with the switch.

In certain embodiments the switch can include an electromechanical switching device. The switch can include a contactor switching device or a relay switching device. The switch parameter can include open/close cycles. The switch monitor can be responsive to instructions to increment a cycle count associated with the switch when the sensor indicates that the switch has opened or closed. The switch margin can includes cycles remaining until a predicted end-of-life of the switch. The predicted end-of-life of the switch can be calculated using at least one of (a) service data of switches in similar applications, (b) a profile of aircraft operation; and (c) test of a similar switch under similar load conditions.

In accordance with certain embodiment the switch arrangement can include a solid-state switching device. The switch can include an IGBT switching device or a MOSFET switching device. The switch parameter can include duration of loading above a predetermined value and below a trip value of the switch. The switch monitor can be responsive to instructions to trigger monitoring when loading exceeds the predetermined value and record at least one of duration and peak loading until the loading drops below the predetermined value. The loading can include current loading or voltage loading. The predetermined value can be about 80% of the switch trip value. The switch margin can be differential between the peak loading and trip value.

An electrical system includes two or more switch arrangements as described above and a switch monitor. The switch monitor can be disposed in communication with the switch arrangement switch monitors and responsive to instructions recorded on a memory. The instructions can cause the switch monitor to determine electrical system margin using the switch margin determined for the switches. A first of the switch arrangements includes an electromechanical switching device, the switch parameter being open/close cycles, and the switch monitor incrementing a cycle count associated with the switch when the sensor indicates that the switch has opened or closed. A second of the switch arrangements includes a solid-state switching device, the switch parameter is duration of loading above a predetermined value and below a trip value of the switch, and the switch monitor trigger monitoring when loading exceeds the predetermined value and record at least one of duration and peak loading until the loading drops below the predetermined value. In certain embodiments the electrical system is an aircraft electrical system.

A method monitoring an electrical system includes receiving a measurement of a switch parameter from a sensor. The measurement is compared to a baseline associated with the switch. Switch margin is determined using the comparison of the measurement with the baseline associated with the switch.

In certain embodiments the switch parameter can be is open/close cycles. A switch cycle associated with the switch can be incremented when the sensor indicates that the switch has opened or closed. The switch margin can be cycles remaining until a predicted end-of-life of the switch and predicted end-of-life of the switch can be calculated using at least one of (a) service data of switches in similar applications, (b) a profile of aircraft operation; and (c) testing of a similar switch under similar load conditions.

In accordance with certain embodiments the switch parameter can be duration of loading above a predetermined value and below a trip value of the switch. Monitoring can be triggered when loading exceeds the predetermined value and one or more of loading duration and peak loading monitored until the loading drops below the predetermined value. Margin of the electrical system can be determined using the determined switch margin for the switch arrangements. The measurements can be acquired during flight of an aircraft, such as during a qualification and test regime.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
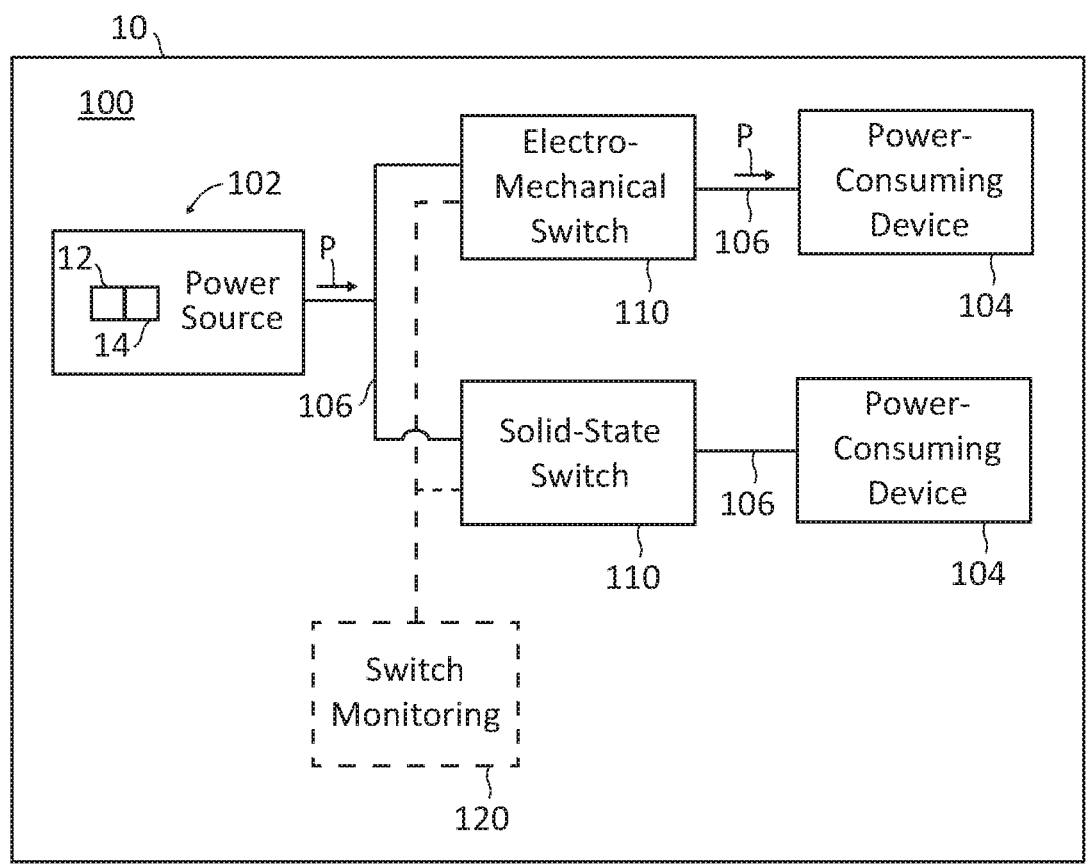
FIG. 1 is a schematic diagram of an exemplary embodiment of an aircraft having an electrical system constructed in accordance with the present disclosure, showing a electromechanical switch arrangement and a solid-state switch arrangement connected to a switch monitor.

Reference will now be made to the drawings wherein like reference numerals identify similar structural features or aspects of the subject disclosure. For purposes of explanation and illustration, and not limitation, a partial view of an exemplary embodiment of a switching arrangement in accordance with the disclosure is shown in FIG. 1 and is designated generally by reference character 100. Other embodiments of switching arrangements, electrical systems, and methods of distribution health management and monitoring of electrical systems in accordance with the disclosure, or aspects thereof, are provided in FIGS. 2-5, as will be described. The systems and methods described herein can be used for testing and/or maintaining switches in electrical systems, such as in the development, qualification and certification of aircraft electrical systems, though the present disclosure is not limited to aircraft electrical systems.

Referring to FIG. 1, an exemplary electrical system 100 is shown. Electrical system 100 includes a power source 102, one or more power-consuming device 104, and a power bus 106. Power bus 106 electrically connects the power-consuming devices 104 to power source 102 and includes one or more switch arrangement to selectively apply electrical power P to the one or more power-consuming device 104. As shown in FIG. 1 power bus 106 includes at least one electromechanical switch arrangement 108 and at least one solid-state switch arrangement 110. Though described herein in the context of an electrical system having an electromechanical switch and a solid-state switch it is to be understood and appreciated that electrical systems multiple electromechanical switches and/or multiple solid-state switch arrangements can also benefit from the present disclosure.

In the illustrated exemplary embodiment electrical system 100 is an aircraft electrical system carried in an aircraft 10. Power source 102 includes a main engine 12 operably connected to a generator 14. A plurality of power-consuming devices 104, e.g., motors and motor controllers, are arranged at various locations on aircraft 10 and connected to power source 102 through electromechanical switch arrangement 108 and/or solid-state switch arrangement 110. While described herein in the context of an aircraft electrical system it is to be understood and appreciated that other types of electrical systems, such as marine and terrestrial electrical systems, can also benefit from the present disclosure.

Figure 2:
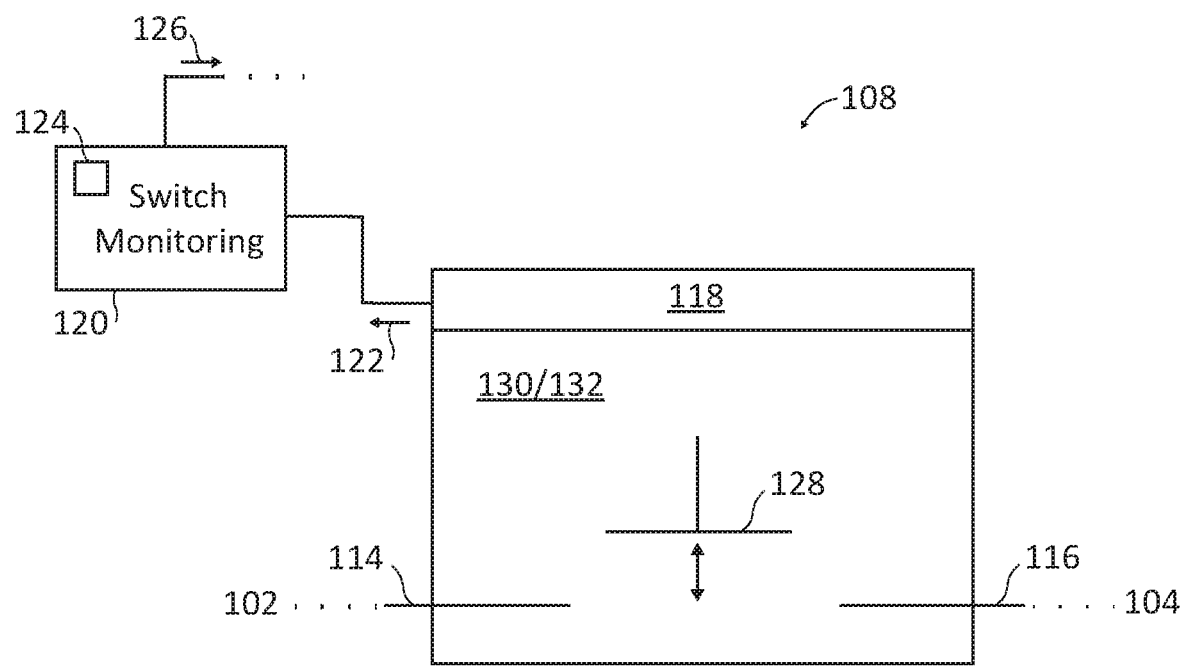
FIG. 2 is a schematic diagram the electromechanical switch arrangement of FIG. 1, showing a sensor coupled to an electromechanical switch of the electromechanical switch arrangement and disposed in communication with the switch monitor.

With reference to FIG. 2, electromechanical switch arrangement 108 is shown. Electromechanical switch arrangement 108 includes an electromechanical switch 112 with a source lead 114 and load lead 116, a sensor 118, and a switch monitor 120. Sensor 118 is coupled to electromechanical switch 112. Switch monitor 120 is disposed in communication with sensor 118 and is responsive to instructions recorded on a memory 138 (shown in FIG. 4) to receive a measurement 122 of a switch parameter from sensor 118, compare measurement 122 to a baseline 124 associated with electromechanical switch 112, and determine switch margin 126 using the comparison of measurement 122 with the baseline 124.

Electromechanical switch 112 has an on-state and an off-state and includes a movable element 128. Movable element 128 is movable between a conducting position and an isolating position. When electromechanical switch 112 is in the on-state movable element 128 assumes the conducting position, movable element 128 electrically connecting source lead 114 and load lead 116 such that power P (shown in FIG. 1) flows between source lead 114 and load lead 116. When electromechanical switch 112 is in the off-state movable element 128 assumes the open position, movable element 128 electrically separating source lead 114 and load lead 116 such that no power flows between source lead 114 and load lead 116. In certain embodiments electromechanical switch 112 includes a contactor switching device 130. In accordance with certain embodiments electromechanical switch 112 includes a relay switching device 132.

As will be appreciated by those of skill in the art, some electromechanical switches can exhibit change in performance over time. For example, the voltage drop between the source lead and the load lead across some switches can increase over the life of some electromechanical devices. Current drop across some switching devices can also increase over the life of some electromechanical switches. Further, in some electromechanical switches, the delay between receipt of a state change command and change in state of some electromechanical switches can increase over the service life of the electromechanical switch, such as due to movable element bouncing. In some electrical systems the change in performance of an electromechanical switch can be such that the electromechanical switch requires replacement. Since such replacements can require the electrical system to be partially (or entirely) de-rated or taken out of service entirely, sensor 116 and switch monitor 120 cooperate with one another to determine switch margin 126 based on cycling of electromechanical switch 112.

Sensor 118 is configured and adapted to provide a signal including measurement 122 to switch monitor 120 to indicate cycling of electromechanical switch 112. For example, in certain embodiments, sensor 118 is coupled to electromechanical switch 112 to monitor contactor auxiliary contact using discrete signals of the sort traditionally read by generator control units and bus power control units. In accordance with certain embodiments, sensor 118 can be coupled to electromechanical switch 112 through an aircraft avionics system, sensor 118 thereby relaying to switch monitor 120 indication of cycling using dialogue within the aircraft avionics system, such as from a central PHM or OMS system. It is also contemplated that sensor 118 can be coupled to electromechanical switch 112 through an analog voltage or current sensing device, sensor 118 thereby measurement 122 based on a current or voltage measurement typically acquired by such sensors as an on/off confirmation following cycling of an electromechanical switch arrangement. The voltage or current measurement can be utilized by the switch monitor 120 to determine increased voltage drop, or degraded performance of the switch contacts over time and provide indication of wear out or damage. Alternatively (or additionally), sensor 118 can be coupled to electromechanical switch 112 such that measurement 122 reports cycle of electromechanical switch 112 based on open/close commands received by electromechanical switch 112.

Figure 3:
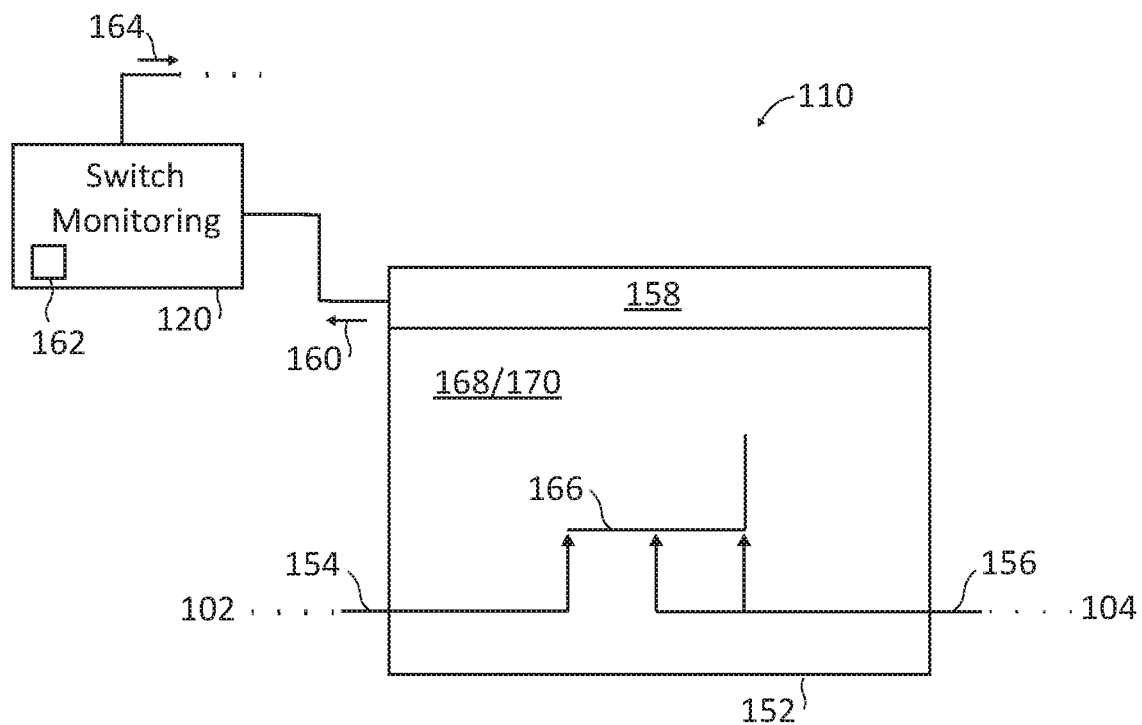
FIG. 3 is a schematic diagram of the solid-state switch arrangement of FIG. 1, showing a sensor coupled to a solid-state switch of the solid-state switching device and disposed in communication with the switch monitor.

With reference to FIG. 3, solid-state switch arrangement 110 is shown. Solid-state switch arrangement 110 includes a solid-state switch 152 with a source lead 154 and load lead 156, a sensor 158, and switch monitor 120. Sensor 158 is coupled to solid-state switch 152. Switch monitor 120 is disposed in communication with sensor 158 and is responsive to instructions recorded on memory 138 (shown in FIG. 4) to receive a measurement 160 of a switch parameter from sensor 158, compare measurement 160 to a baseline 162 associated with solid-state switch 152, and determine switch margin 164 of solid-state switch 152 using the comparison of measurement 160 with the baseline 162.

Solid-state switch 152 has an on-state and an off-state and includes a gate 166. Gate 166 is arranged to receive a command voltage (current) to change resistance of a semiconductor material contained within solid-state switch 152. Based on the presence (or absence) of the command voltage (current) solid-state switch 152 changes between the on-state and the off-state, solid-state switch 152 electrically connecting source lead 154 and load lead 156 such that power P (shown in FIG. 1) flows between source lead 154 and load lead 156. When solid-state switch 152 is in the off-state no power flows between source lead 154 and load lead 156. In certain embodiments solid-state switch 152 includes an IGBT switching device 168. In accordance with certain embodiments solid-state switch 152 includes a MOSFET switching device 170.

As will be appreciated by those of skill in the art, some solid-state switches can exhibit change in performance over time. For example, performance of some solid-state switching devices can change if subjected to elevated voltage or current that are below the trip value of the solid-state switching device. Performance of some solid-state switching devices can also change if subjected to elevated voltage or current for extended periods of time. In some electrical systems exposure to voltages or currents below the trip level can change the performance of certain solid-state switch devices such that replacement of the solid-state switching device is necessary. Since such replacement event can require the electrical system to be partially (or entirely) de-rated or taken out of service entirely, sensor 158 and switch monitor 120 cooperate with one another to determine switch margin 164 based on voltage and/or current exposure of solid-state switch 152.

Sensor 158 is configured and adapted to provide a signal including measurement 160 to switch monitor 120. Measurement 160 indicates voltage and/or current exposure of the solid-state switch 152. For example, in certain embodiments, sensor 158 is coupled to solid-state switch 152 to measure voltage across source lead 154 and load lead 156. In accordance with certain embodiments, sensor 158 can be coupled to solid-state switch 152 to measure current flow between source lead 154 and load lead 156. It is contemplated that, based on measurement 160, switch monitor 120 update either (or both) of a peak voltage log and peak current log when triggered. Logging can be triggered, for example, according to a predetermined sub-trip value 170 (shown in FIG. 4), e.g., a sub-trip value, recorded in memory 138 (shown in FIG. 4) of switch monitor 120.

Figure 4:
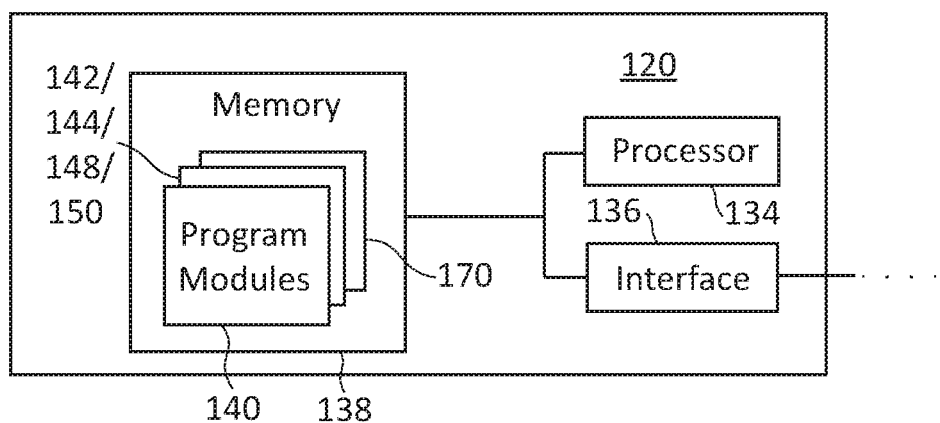
FIG. 4 is a schematic diagram of the switch monitor shown in FIG. 1, showing the switch monitor receiving measurements, electromechanical switch cycles, and solid-state switch loading to determine margin of the electromechanical switch, the solid-state switch, and the electrical system.

Referring now to FIG. 4, switch monitor 120 is shown. Switch monitor 120 includes a processor 134, an interface 136, and a memory 138. Memory 138 has a plurality of program modules 140 recorded on it that, when read by processor 134, cause processor 134 to undertake certain actions. Among those actions are operations of an electrical system health management and monitoring method 200 (shown in FIG. 5), as will be described.

With respect to electromechanical switch 112 (shown in FIG. 2), switch monitor 120 (shown in FIG. 2) is responsive to the instructions recorded in program modules 140 to increment a cycle count 142 associated with electromechanical switch 112 when sensor 118 (shown in FIG. 2) indicates that electromechanical switch 112 has opened or closed, i.e., that movable element 128 has displaced between the electrically open and electrically closed positions. Based on measurement 122 (shown in FIG. 2), switch monitor 120 calculates the expected number of cycles remaining until a predicted end-of-life 144 of electromechanical switch 112 by comparing baseline 124 with cycle count 142. It is contemplated that predicted end-of-life 144 of electromechanical switch 112 can be calculated using at least one of (a) service data 146 of switches in similar applications (or identical applications), (b) a profile 148 of aircraft operation; and (c) testing results 150 of similar electromechanical switches of similar construction (or of identical construction) and under similar load conditions (or identical load conditions). It is contemplated that time and flight leg data from an aircraft avionics systems or algorithms resident with controllers on the aircraft provide indication of rate of change in cycle count, thereby allowing predicated end-of-life to be adjusted according to changes in operation of the electrical system.

With respect to solid-state switch 152 (shown in FIG. 3), switch monitor 120 (shown in FIG. 2) is responsive to the instructions recorded in program modules 140 to record peak voltage, peak current, duration of peak voltage, and duration of peak current according to trigger predetermined value 170. In certain embodiments predetermined value 170 is about 80% of the trip value associated with solid-state switch 152. It is contemplated that predetermined value 170 be programmable such that logging is enabled during development, qualification, and certification of electrical system 100 (shown in FIG. 1). For example, it is contemplated that predetermined value 170 be determined based upon flight testing under actual electrical system loads and operational scenarios, thereby providing electrical system robustness through margin determination on a switch-by-switch basis in electrical system 100.

Figure 5:
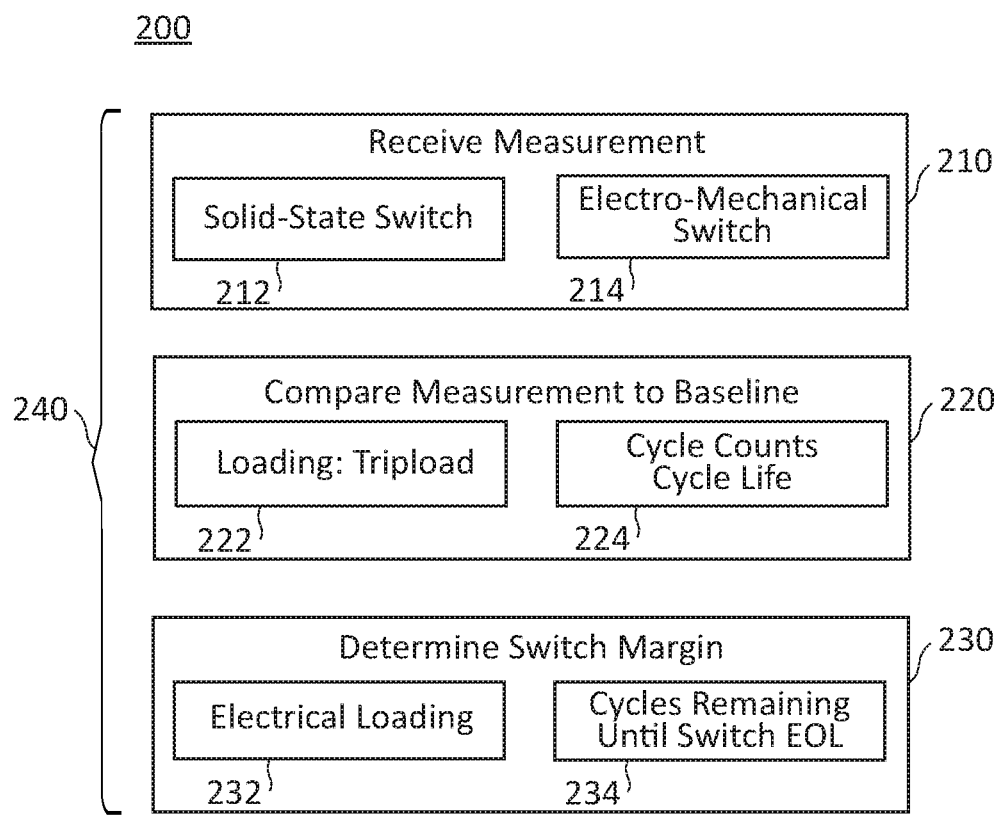
FIG. 5 is block diagram of an electrical system health management and monitoring method, showing steps of the method.

With reference to FIG. 5, electrical system health management and monitoring method 200 is shown. Monitoring method 200 includes receiving a measurement, e.g., measurement 122 (shown in FIG. 2) and/or measurement 160 (shown in FIG. 3), from a sensor, as shown with box 210. The measurement can be received from a sensor coupled to an electromechanical switch, e.g., electromechanical switch 112 (shown in FIG. 1), as shown with box 214. The measurement can be received from a solid-state switch, e.g., solid-state switch 152 (shown in FIG. 3), as shown with box 212.

The measurement is compared to a baseline, e.g., cycle count baseline 124 (shown in FIG. 2) and/or loading baseline 162 (shown in FIG. 3), associated with the switch, as shown with box 220. As shown with box 224, the comparison can be actual cycles of the electromechanical switch compared to a predicted end-of-life of the electromechanical switch. As shown in with box 222, the comparison can be electrical load exerted on the solid-state switch above a sub-trip predetermined value. Switch margin is determined using the comparison of the measurement with the baseline associated with the switch, as shown with box 230.

In certain embodiments the switch parameter can be open/close cycles. A switch cycle associated with the switch can be incremented when the sensor indicates that the switch has opened or closed. The switch margin can be cycles remaining until a predicted end-of-life of the switch and predicted end-of-life of the switch can be calculated using at least one of (a) service data of switches in similar applications, (b) a profile of aircraft operation; and (c) test of a similar switch under similar load conditions.

In accordance with certain embodiments the switch parameter can be duration of loading above a predetermined value and below a trip value of the switch. Monitoring can be triggered when loading exceeds the predetermined value and one or more of loading duration and peak loading monitored until the loading drops below the predetermined value. Margin of the electrical system, and more particularly the load switching components of the electrical system, can be determined using the determined switch margin for the switch arrangements. The measurements can be acquired during flight of an aircraft, such as during a qualification and test regime, as shown with bracket 240. It is contemplated that the measurements can be utilized during system development and qualification testing, such as EMC and systems performance testing, to demonstrate robust design margin.

The methods and systems of the present disclosure, as described above and shown in the drawings, provide for switch arrangements, electrical systems, and electrical system health management and monitoring methods with superior properties including margin determination and robustness assessment for solid-state power controllers (SSPC), such as current-to-trip (I2T) and/or instant trip protection devices in aircraft electrical systems. Further, cycle count monitoring is provided to allow for predictive maintenance of electromechanical devices like contactors and relays. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A switch arrangement, comprising:
   a switch with a source lead and a load lead;
   a sensor coupled to the switch;
   a switch monitor in communication with the sensor and responsive to instructions recorded on a memory to:
      receive a measurement of a switch parameter from the sensor;
      compare the measurement to a baseline associated with the switch; and
      determine switch margin using the comparison of the measurement with the baseline associated with the switch.

2. The switch arrangement as recited in claim 1, wherein the switch includes an electromechanical switching device.

3. The switch arrangement as recited in claim 1, wherein the switch includes a contactor switching device or a relay switching device.

4. The switch arrangement as recited in claim 1, wherein the switch parameter is open/close cycles, wherein the instructions further cause the switch monitor to increment a cycle count associated with the switch when the sensor indicates that the switch has opened or closed.

5. The switch arrangement as recited in claim 1, wherein the switch margin is cycles remaining until a predicted end-of-life of the switch.

6. The switch arrangement as recited in claim 1, wherein the predicted end-of-life of the switch is calculated using at least one of (a) service data of switches in similar applications, (b) a profile of aircraft operation; and (c) test of a similar switch under similar load conditions.

7. The switch arrangement as recited in claim 1, wherein the switch includes a solid-state switching device.

8. The switch arrangement as recited in claim 1, wherein the switch includes an IGBT switching device or a MOSFET switching device.

9. The switch arrangement as recited in claim 1, wherein the switch parameter is duration of loading above a predetermined value and below a trip value of the switch, wherein the instructions cause the switch monitor:
   trigger monitoring when loading exceeds the predetermined value; and
   record at least one of duration and peak loading until the loading drops below the predetermined value.

10. The switch arrangement as recited in claim 9, wherein the loading is current loading or voltage loading.

11. The switch arrangement as recited in claim 9, wherein the predetermined value is about 80% of the switch trip value.

12. The switch arrangement as recited in claim 1, wherein the switch margin is a differential between the peak loading and trip value.

13. An electrical system, comprising:
   a plurality of switch arrangements as recited in claim 1; and
   a switch monitor disposed in communication with the plurality of switch monitors and responsive to instructions recorded on a memory to determine electrical system margin using the switch margin determined for the switches,
   wherein a first switch arrangement of the plurality of switch arrangements includes an electromechanical switching device,
   wherein the switch parameter for the first switch arrangement is open/close cycles, wherein the instructions further cause the switch monitor of the first switch arrangement to increment a cycle count associated with the switch of the first switch arrangement when the sensor of the first switch arrangement indicates that the switch of the first switch arrangement has opened or closed, and
   wherein a second switch arrangement of the plurality of switch arrangements includes a solid-state switching device, wherein the switch parameter for the second switch arrangement is duration of loading above a first predetermined value and below a trip value of the switch of the second switch arrangement,
   wherein the instructions cause the switch monitor of the second switch arrangement to trigger monitoring when loading exceeds a second predetermined value and record at least one of duration and peak loading until the loading drops below the second predetermined value.

14. The electrical system as recited in claim 13, wherein the electrical system is an aircraft electrical system.

15. An electrical system health management and monitoring method performed by a switch monitor, the method comprising:
receiving a measurement of a switch parameter of a switch from a sensor coupled to the switch;
comparing -the measurement to a baseline associated with the switch; and
determining switch margin using the comparison of the measurement with the baseline associated with the switch.

16. The method as recited in claim 15, wherein the switch parameter is open/close cycles, the method further comprises incrementing a cycle count associated with the switch when the sensor indicates that the switch has opened or closed.

17. The method as recited in claim 15, wherein the switch margin is cycles remaining until a predicted end-of-life of the switch, the method further comprising calculating the predicted end-of-life using at least one of (a) service data of switches in similar applications, (b) a profile of aircraft operation; and (c) test of a similar switch under similar load conditions.

18. The method as recited in claim 15, wherein switch parameter is duration of loading above a predetermined value and below a trip value of the switch, the method further comprising:
triggering monitoring when loading exceeds the predetermined value; and
recording at least one of duration and peak loading until the loading drops below the predetermined value.

19. The method as recited in claim 15, further comprising determining electrical system margin using the determined switch margin.

20. A switch arrangement of an electrical system of an aircraft, comprising:
a switch with a source lead and a load lead;
a sensor coupled to the switch;
a switch monitor in communication with the sensor and responsive to execution of instructions recorded on a memory, which when executed by the switch monitor cause the switch monitor to:
receive a measurement of a switch parameter from the sensor;
compare the measurement to a baseline associated with the switch; and
determine switch margin associated with a predicted end of life using the comparison of the measurement with the baseline associated with the switch, wherein the predicted end of life is calculated using a profile of aircraft operation.

* * * * *